(12) United States Patent
Xu et al.

(10) Patent No.: US 6,906,835 B1
(45) Date of Patent: Jun. 14, 2005

(54) DOPED STOICHIOMETRIC LITHIUM NIOBATE CRYSTALS AND METHOD FOR HIGH-SPEED HOLOGRAPHIC DATA STORAGE

(75) Inventors: Xuewu Xu, Singapore (SG); Sanjeev Solanki, Singapore (SG); Tow Chong Chong, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 10/841,681

(22) Filed: May 10, 2004

(51) Int. Cl.$^7$ ................................................ G03H 1/02
(52) U.S. Cl. ....................... 359/7; 359/3; 430/1; 430/2; 365/125; 365/216
(58) Field of Search .......................... 359/3, 7; 430/1, 430/2; 365/125, 216

(56) References Cited

U.S. PATENT DOCUMENTS 5,717,508 A * 2/1998 Stoll .............................. 359/3
6,373,806 B1 * 4/2002 Kitamura et al. ........... 369/103

OTHER PUBLICATIONS

M.Lee et al., "Angle–multiplexed hologram storage in LiNbO3:Tb,Fe", Optics Letters, 15(18), pp. 1337–1339(2000).*

S.Tao et al., "Holographic properties of doped stochiometric LiNbO3 crystals", vol. 4085, pp. 46–50(2001).*

* cited by examiner

Primary Examiner—Leonidas Boutsikaris
(74) Attorney, Agent, or Firm—Lawrence Y. D. Ho & Associates

(57) ABSTRACT

The present invention discloses a recording medium comprising an improved doped Stoichiometric Lithium Niobate (SLN) crystal for high-speed holographic data storage. The improved doped SLN has an extremely high optical damage resistance of more than 145 kW/cm$^2$ for power density of an incident laser beam along the c axis. The Recording time using the present improved doped SLN is advantageously very short and is about 1 second for a single hologram with a saturated diffraction efficiency of 28.7% at a recording laser beam density of 70 W/cm$^2$. Reliable retrieval of a signal-image written at as low as 1 milliseconds has been performed in the Z-cut doped SLN. The present recording medium is an improved doped SLN of a Z-cut SLN crystal doped with Iron (Fe) and Terbium (Tb). The Terbium (Tb) content within the fluxed melts for growing the improved doped SLN ranges from 10 ppm to 140 ppm.

10 Claims, 11 Drawing Sheets

DOPED STOICHIOMETRIC LITHIUM NIOBATE CRYSTALS AND METHOD FOR HIGH-SPEED HOLOGRAPHIC DATA STORAGE

FIELD OF THE INVENTION

The present invention generally relates to crystals for holographic recordings. In particular, the invention relates to doped Stoichiometric Lithium Niobate (SLN) crystals and method for high-speed holographic data storage.

BACKGROUND OF THE INVENTION

Data storage technologies have been dominated by magnetic and conventional optical data storage technologies, where data are stored as distinct magnetic or optical packages on the surface of a recording medium. These methods rely on the surface area available and do not utilize the entire volume of the recording medium. Holographic data storage is a promising approach of utilizing the entire volume of the recording medium for data storage.

In holographic data storage, data is stored as an optical interference pattern within a volume of recording medium of photosensitive optical material such as a photorefractive crystal. This is done by intersecting two laser beams within the recording medium. The first laser beam is the object beam and contains the data to be stored. The second laser beam is referred to as the reference beam and is used for reproducing the stored data from the recording medium. The resulting optical interference pattern causes chemical and/or physical changes in the recording medium. A replica of the interference pattern is stored as a change in the refractive index of the recording medium.

A large number of these interference patterns can be superimposed in the same piece of recording medium as long as they are distinguishable by the spacing of the gratings. Such spacing can be created by varying angles between the object and reference beams, which is referred to as Angular Multiplexing. Alternatively, varying the wavelengths of the lasers in a technique known as Wavelength Multiplexing can achieve a similar result. Other techniques such as Phase Code, Peristropic and Shift Multiplexing are also implemented. Using such multiplexing techniques, the theoretical limit of storage density in holographic data storage is around tens of terabits per cubic centimeter.

In addition to high storage density, holographic data storage allows for very high data transfer rates and fast access times, as data is recorded page by page and laser beams can be manipulated without inertia, unlike actuators and motors in disk drives.

Despite the advantages of holographic data storage, there are limitations caused by the quality and the effectiveness of the recording medium. The recording medium is primarily a crystal and the main workhorses in the field of holographic recording are Lithium Niobate ($LiNbO_3$) crystals.

Lithium Niobate has favorable photorefractive characteristics that make it suitable for holographic recording. Doping Lithium Niobate with transition-metal or rare-earth ions such as Iron (Fe) and Cerium (Ce) enhances these characteristics. At present iron doped Lithium Niobate ($Fe:LiNbO_3$) is considered one of the best options for a recording medium. Using stoichiometric $LiNbO_3$ ([Li]/[Nb]=1) has further enhanced the performance of the crystal especially when doped with Fe.

However, regardless of the desirability of using Fe doped $LiNbO_3$ crystal, it inherently has some bottlenecks that limit the operating ranges of the crystal. The relatively low sensitivity of $Fe:LiNbO_3$ has limited the data recording speed. Strong beam-fanning effects and low optical damage thresholds prevent the use of focused laser beams with high power density in increasing the data recording speed and density on the holographic medium.

It can thus be seen that there exists a need for improved doped Stoichiometric Lithium Niobate (SLN) crystals for high-speed holographic recordings that can overcome the disadvantages of the existing art.

SUMMARY OF THE INVENTION

The present invention seeks to provide a recording medium and a method for high-speed holographic data storage using doped Stoichiometric Lithium Niobate (SLN) crystals.

Accordingly, in one aspect, the present invention provides, a recording medium for high-speed holographic data storage, comprising a Z-cut crystal of terbium and iron doped stoichiometric lithium niobate; wherein the crystal has an optical damage resistance of more than 145 $kW/cm^2$ and exhibits negligible transverse beam fanning when a laser beam is incident near a Z-axis of the crystal; further wherein terbium content within fluxed melts for growing the crystal ranges from 10 ppm to 140 ppm.

In another aspect, the present invention provides, a method for high-speed holographic data storage, using a Z-cut crystal of terbium and iron doped stoichiometric lithium niobate as a recording medium, the method comprising: utilizing the crystal in a Reflection geometry configuration; and exposing the crystal to a reference beam and an object beam bearing one image.

BRIEF DESCRIPTION OF THE DRAWINGS

A preferred embodiment of the present invention will now be more fully described, with reference to the drawings of which.

DETAILED DESCRIPTION OF THE DRAWINGS

In the following description, details are provided to describe the preferred embodiment. It shall be apparent to one skilled in the art, however that the invention may be practiced without such details. Some of the details may not be described at length so as not to obscure the invention.

In the present invention, a recording medium comprising an improved doped Stoichiometric Lithium Niobate (SLN) crystal for high-speed holographic data storage is disclosed. The Z cut crystal sample of the improved doped SLN has an extremely high optical damage resistance of more than 145 kW/cm² for power density of an incident laser beam. The recording time using the present improved doped SLN and reflection recording geometry is advantageously very short and is about 1 second for a single hologram with a saturated diffraction efficiency of 28.7% at a total recording laser beam intensity of 70 W/cm². Reliable retrieval of a signal-image written at as low as 1 milliseconds may be performed in the Z-cut doped SLN. The present recording medium comprises an improved doped SLN of a Z-cut SLN crystal doped with Iron (Fe) and Terbium (Tb). The Terbium (Tb) content within the fluxed melts for growing the improved doped SLN ranges from 10 ppm to 140 ppm.

The Iron and Terbium doped SLN (Fe:Tb:SLN) were grown by the Top-Seeded Solution Growth (TSSG) method in two different compositions producing two crystals as shown in Table 1 (i.e. Fe:Tb:SLN-1 and Fe:Tb:SLN-2). A Fe:SLN crystal was also prepared to act as a reference when comparing with the performance of the Fe:Tb:SLN crystals. The doping concentrations and compositions of the fluxed melt for all 3 crystals are shown in Table. 1.

TABLE 1

| Sample name | (mol %) | | | Doping Concentration in the fluxed melt (ppm in weight) | |
|---|---|---|---|---|---|
| | $Li_2CO_3$ (5N purity) | $Nb_2O_5$ (4N purity) | $K_2CO_3$ flux (3N purity) | $Fe_2O_3$ (4N purity) | $Tb_4O_7$ (3N purity) |
| Fe:SLN | 42.02 | 42.02 | 15.96 | 100 | 0 |
| Fe:Tb:SLN-1 | 42.02 | 42.02 | 15.96 | 100 | 10 |
| Fe:Tb:SLN-2 | 42.02 | 42.02 | 15.96 | 100 | 140 |

The crystal sample Fe:Tb:SLN-1 differs from Fe:Tb:SLN-2 only in the concentration of the dopant Terbium (Tb).

The as-grown crystals were orientated using an X-ray goniometer and cut parallel to their X and Z faces to obtain the X-cut and Z-cut samples of Fe:Tb:SLN and Fe:SLN. The samples were then lapped and polished to a thickness of about 2–3 mm. All crystal samples were single-domain crystals and reduced at 950° C. in an Argon (Ar) atmosphere for 6 hours.

Figure 1:
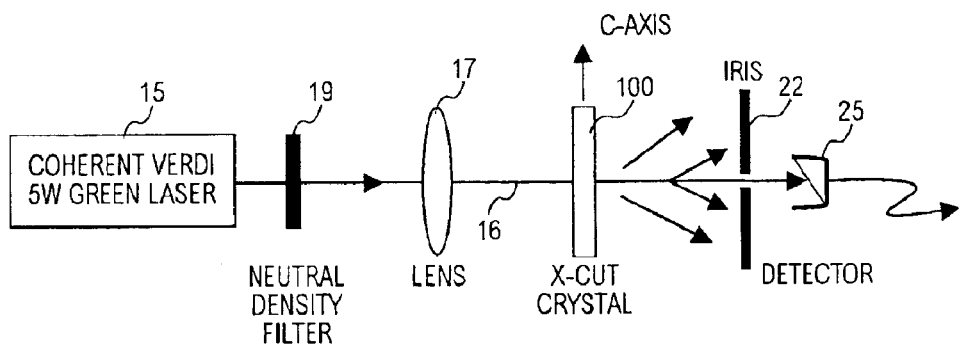
FIG. 1 illustrates an experimental setup for measuring beam fanning and optical damage effects in X-cut crystal samples in accordance with the present invention.
Figure 2:
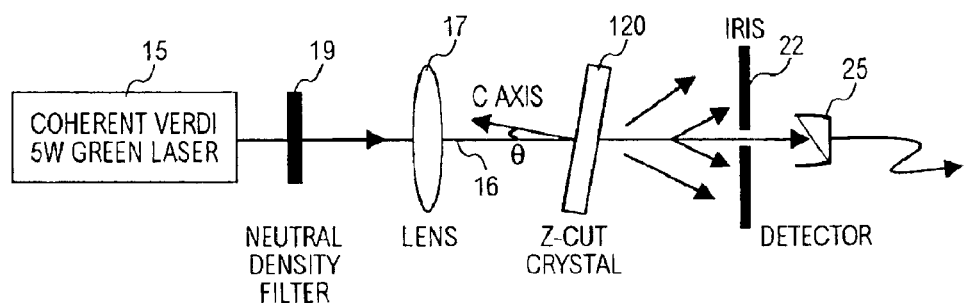
FIG. 2 illustrates the experimental setup for measuring beam fanning and optical damage effects in Z-cut crystal samples in accordance with the present invention.

Referring to FIG. 1 and FIG. 2, the experimental setup for measuring the threshold effects of beam fanning and optical damage in the X-cut samples and Z-cut samples are shown respectively. A common laser source 15 such as a Coherent Verdi 5W green laser with the wavelength of 532 nm is used for both experimental setups.

For the X-cut sample 100 in FIG. 1, an extraordinary-polarized laser beam 16 from the laser source 15 is incident normally onto the X-cut sample 100 and is perpendicular to the c-axis of the X-cut sample 100. The laser beam 16 spot size is about 2.0 mm and focused inside the sample by a lens 17 with a focal length of 25 cm or 11 cm. The incident light intensity is varied using a neutral density filter 19.

Lithium Niobate is a polar crystal and has a polar axis along the Z axis (c axis) of the crystal. For a single domain Lithium Niobate crystal, all dipoles are aligned along the Z axis. For the Z-cut sample 120, the ordinary/extraordinary-polarized laser beam 16 is incident onto +Z or −Z face of the sample and the angle of incidence θ between the incident laser beam 16 and the c-axis of the Z-cut sample can be varied between 0° and 45°.

The scattered light is blocked by an iris 22 with a diameter of 3 mm behind the samples 100, 120. A detector 25 is located behind the iris 22 and in line with the incident laser beam 16 to measure the transmitted light intensity of the laser beam 16.

The scattering light intensity due to beam fanning and optical damage effects can be defined by the scattering ratio $R=I_s/I_i$, where $I_s=(I_{t0}-I_{t1})$. Where $I_{t0}$ and $I_{t1}$ are the transmitted light intensity at t=0 and t=10~60 minutes respectively and $I_i$ is the incident light intensity. $I_{t1}$ is chosen when it reaches a minimum or a maximum (for the case of +Z face).

Figure 3:
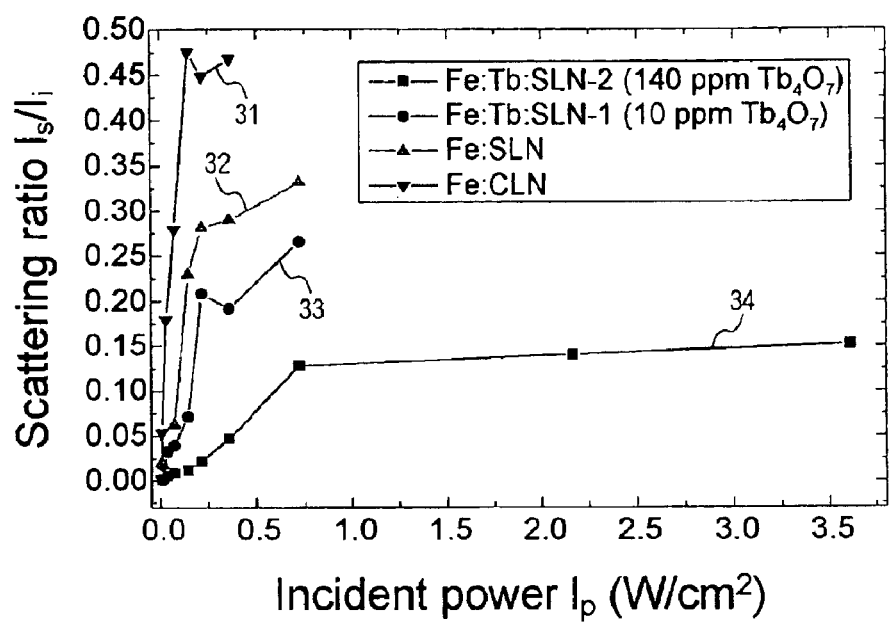
FIG. 3, FIG. 4, FIG. 5 and FIG. 6 illustrates graphs showing results of experiments of FIG. 1 and FIG. 2.

Referring to FIG. 3, the effects of beam fanning in the X-cut samples are shown. For comparison purposes, an additional iron-doped congruent $LiNbO_3$ (Fe:CLN) crystal sample is also used. The reduced X-cut iron-doped congruent $LiNbO_3$ (Fe:CLN) crystal sample has a mole ratio of [Li]/[Nb]=0.946. We observe from FIG. 3, that as the incident laser power density $I_p$ increases, the scattering ratio of line 31, line 32 and line 33 which are representative of the scattering ratio of samples of Fe:CLN, Fe:SLN and Fe:Tb:SLN-1 respectively also increases. However, for line 34 which represents the scattering ratio of the Fe:Tb:SLN-2 sample having a very much higher content of Terbium, the scattering ratio is much lower even at the higher power densities of the incident laser.

All the X-cut samples showed strong beam-fanning effects and were optically damaged at relatively low incident power density. The Fe:CLN sample has the strongest beam-fanning effect and very low threshold power density. The optical damage thresholds and the beam fanning thresholds of the samples are shown here in Table.2 where the laser beam power intensity thresholds $I_{th}$ are listed.

TABLE 2

| Sample name | Concentration of Terbium (Tb$_4$O$_7$ in ppm) | X-cut (I$_{th}$ ≡ W/cm$^2$) | |
|---|---|---|---|
| | | Beam fanning | Optical damage |
| Fe:SLN | 0 | I$_{th}$ = 0.007 | I$_{th}$ = 0.144 |
| Fe:Tb:SLN-1 | 10 | I$_{th}$ = 0.036 | I$_{th}$ = 0.217 |
| Fe:Tb:SLN-2 | 140 | I$_{th}$ = 0.216 | I$_{th}$ = 0.722 |
| Fe:CLN | 0 | I$_{th}$ = 0.014 | I$_{th}$ = 0.144 |

Figure 4:
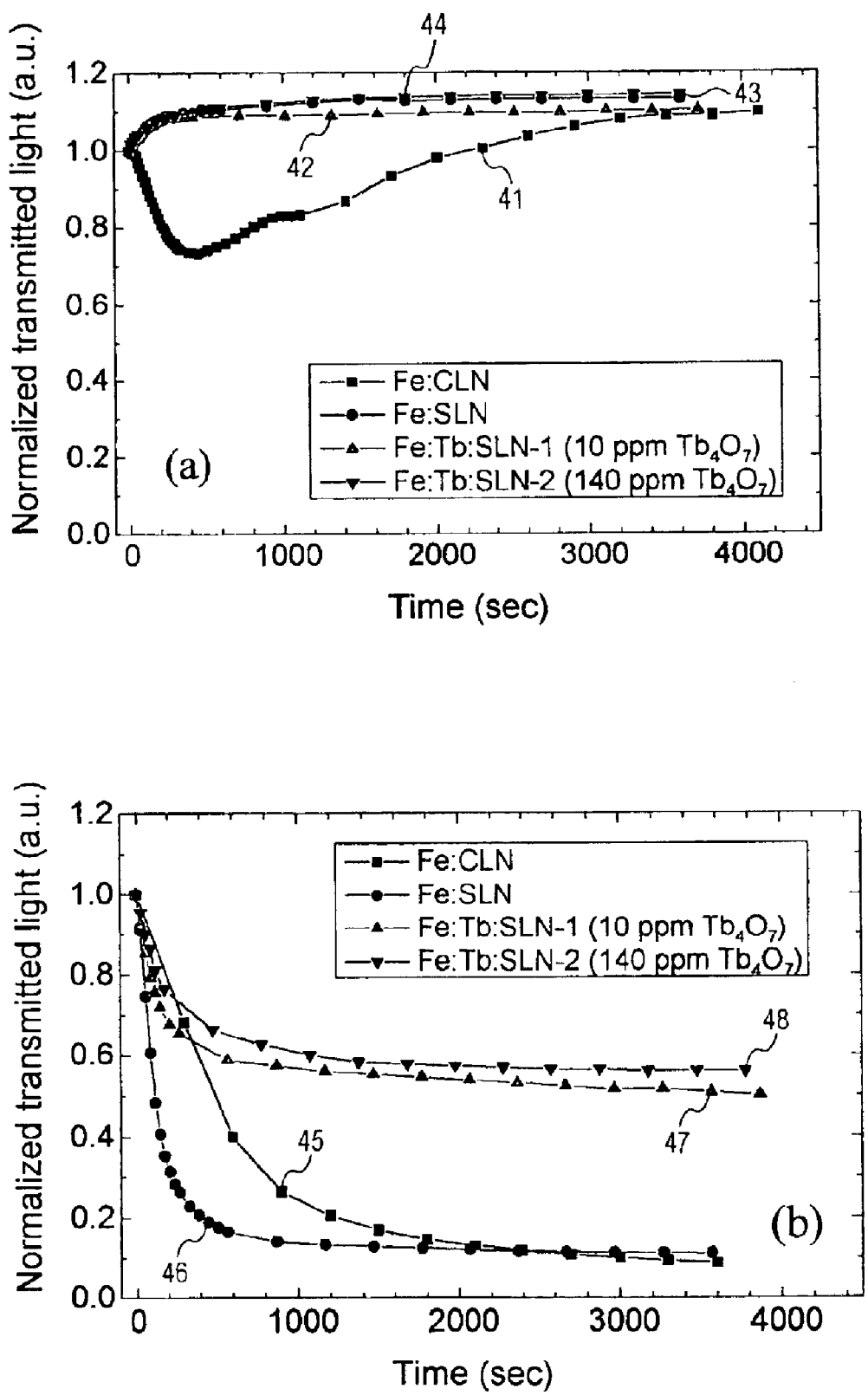

The time dependence of the change in transmitted light intensity at the incident power density of I$_p$=3.6 W/cm$^2$ is shown in FIG. 4a and FIG. 4b for +Z and −Z faces of the Z-cut crystal samples, respectively. Referring to FIG. 4a, it can be seen that the +Z face of Fe:CLN (line 41) has shown some scattering within the first 40 minutes, and then the scattering is much reduced. However, the +Z faces of Fe:SLN (line 43), Fe:Tb:SLN-1 (line 42) and Fe:Tb:SLN-2 (line 44) have shown almost no scattering effect and the transmitted light intensities slightly increase at the very beginning and then keep almost constant.

In contrast, referring to FIG. 4b all the −Z faces of the Z-cut samples have shown backward scattering. Both Fe:CLN (line 45) and Fe:SLN (line 46) exhibit the strongest backward scattering and the transmitted light intensity decreases almost to zero after 10–25 minutes. The transmitted light intensity of Fe:SLN decreases faster than that of Fe:CLN. However, the backward scattering of both the Fe:Tb:SLN-1 (line 47) and Fe:Tb:SLN-2 (line 48) samples has been much reduced by the addition of Tb into the crystal. More than 50% of the transmitted light intensity was remained and the transmitted laser beam could maintain a bright beam spot at the center with a good beam shape.

Referring to Table.3, the measured transmitted light intensities of different Z-cut crystal samples at the incident laser power density of 72 W/cm$^2$ and 30 kW/cm$^2$ are listed, respectively. It can be seen that the −Z face of Fe:CLN can not maintain necessary transmitted laser intensity due to its strong backward scattering although its +Z face can keep high intensity. The transmitted laser beam for the −Z face of Fe:SLN has higher transmitted light intensity than that of Fe:CLN. The transmitted beam intensity and beam shape for the −Z faces of Fe:Tb:SLN-1 and Fe:Tb:SLN-2 have been further improved by adding a small amount of Tb.

TABLE 3

| Crystal Sample | Incident intensity: 1 mW; Power density: 72 W/cm$^2$ | Incident intensity: 414 mW Power density: 30 kW/cm$^2$ | |
|---|---|---|---|
| | −Z face | −Z face | +Z face |
| Fe:CLN | 5 μW | 2 mW | 128 mW |
| Fe:SLN | 40 μW | 68 mW | 115 mW |
| Fe:Tb:SLN-1 | 150 μW | 85 mW | 122 mW |
| Fe:Tb:SLN-2 | 110 μW | 75 mW | 114 mW |

Figure 5:
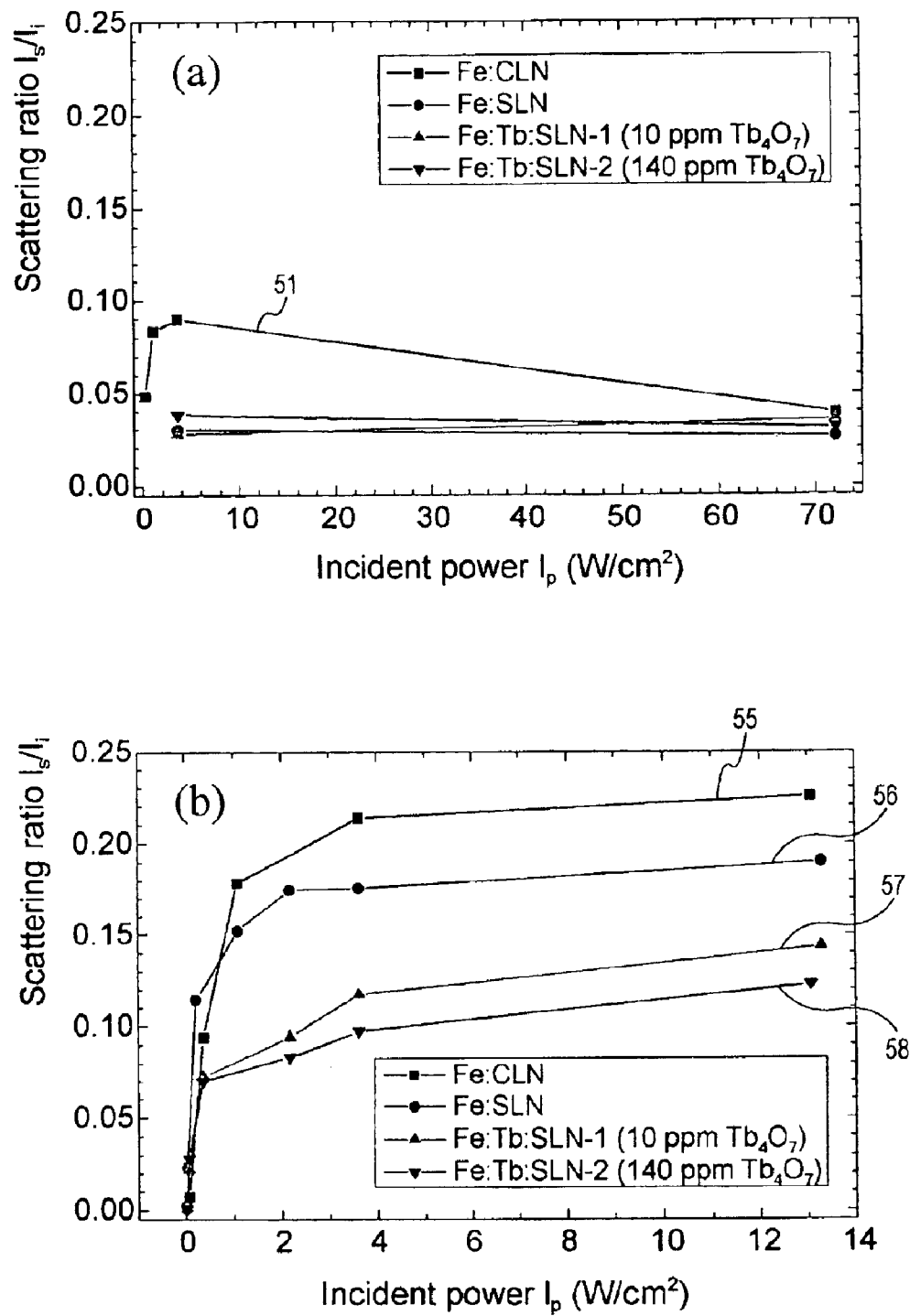

Referring to FIG. 5, the effects of beam fanning in the Z-cut samples are shown. In FIG. 5a, we can see that for +Z faces the beam fanning effects are weak as the scattering ratios are relatively low and only Fe:CLN (line 51) shows slightly stronger scattering.

However, in FIG. 5b, we observe light-induced scattering due to backward scattering effect in −Z faces. Fe:CLN (line 55) has the highest scattering ratio while Fe:SLN (line 56) has less. The scattering ratio however for the Terbium doped samples (line 57 and 58) are significantly reduced.

Figure 6:
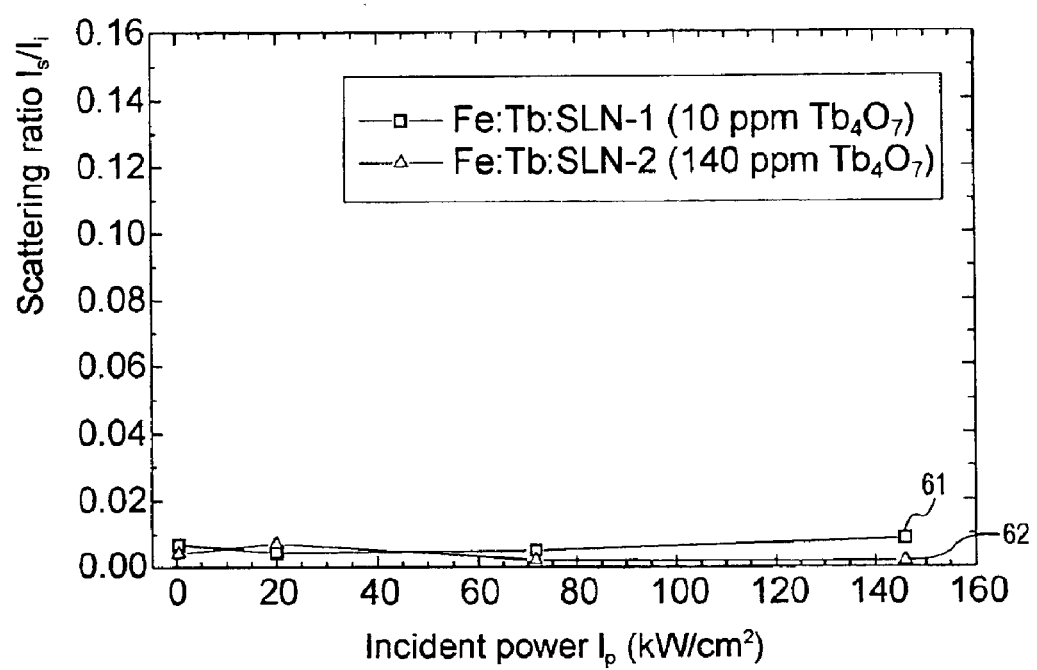

Further tests were conducted with the Z-cut terbium doped samples, and the power density of the incident laser beam was increased to 150 kW/cm$^2$. Referring to FIG. 6, the scattering ratios of line 61 and 62 for +Z faces of the Z-cut Fe:Tb:SLN crystal samples at high incident light densities did not vary substantially, also indicating that the optical damage threshold of the samples have not been breached. The −Z faces of the Z-cut Fe:Tb:SLN crystal samples show similar behavior and also have a very low scattering ratio at high incident light densities. The Z-cut terbium doped samples have withstood laser incident beams with intensities in excess of 150,000 times that of the thresholds of the X-cut terbium doped samples. The Z-cut terbium doped samples thus advantageously allows the use of high power density focused lasers to be incident on the crystal samples.

Along the Z axis, all the Z-cut Fe:SLN and Fe:Tb:SLN crystal samples exhibited no optical damage under the test conditions. The images of the transmitted laser beam spots at incident power density of 152 kW/cm$^2$ on the +Z faces are shown in FIG. 7a, FIG. 7c, FIG. 7e, and FIG. 7g for Fe:CLN, Fe:SLN, Fe:Tb:SLN-1 and Fe:Tb:SLN-2 respectively. Similarly, the images of the transmitted laser beam spots at incident power density of 152 kW/cm$^2$ on the −Z faces are shown in FIG. 7b, FIG. 7d, FIG. 7f, and FIG. 7h for Fe:CLN, Fe:SLN, Fe:Tb:SLN-1 and Fe:Tb:SLN-2 respectively.

Figure 7:
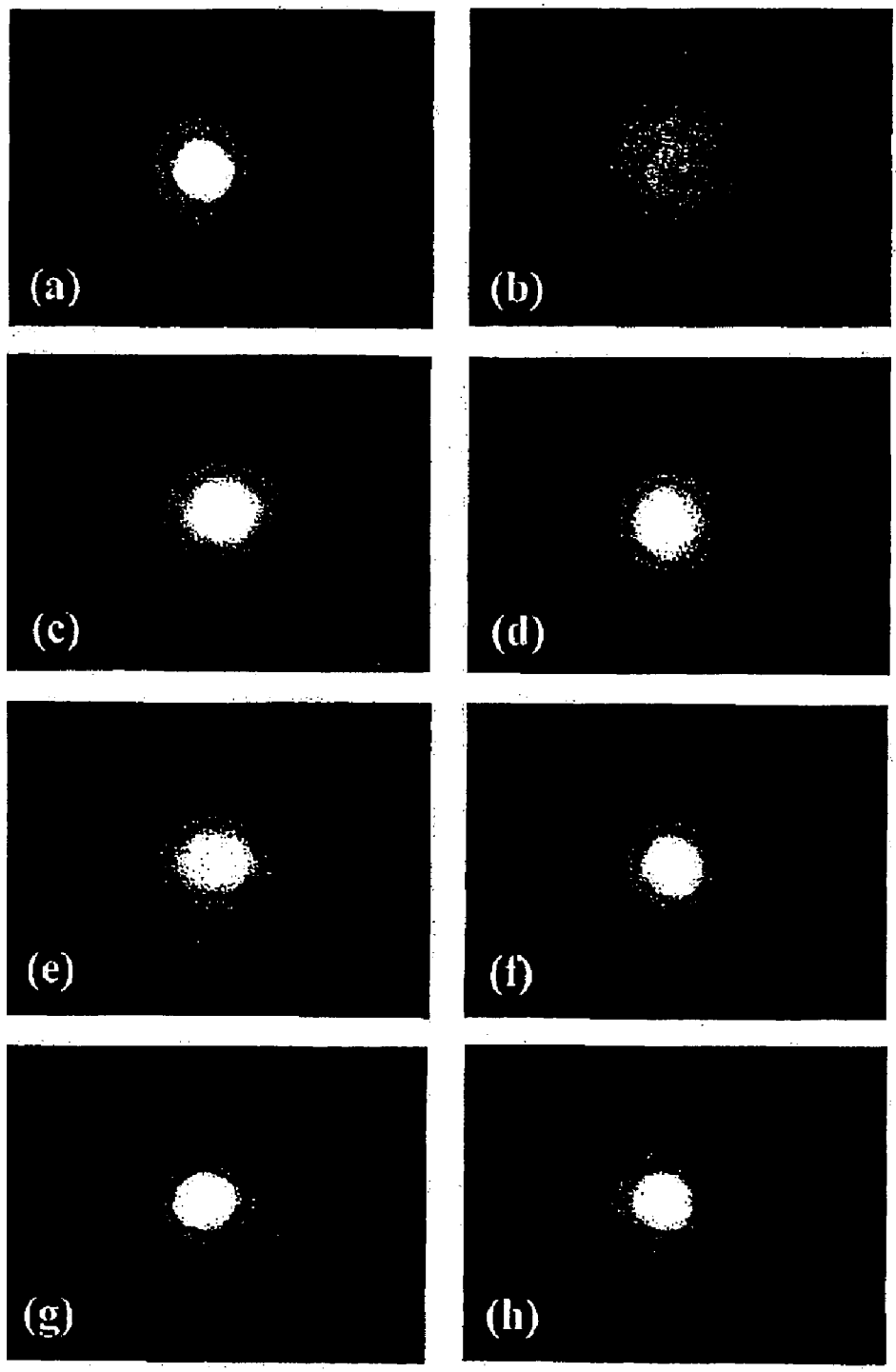
FIG. 7 illustrates transmitted spot images of the laser beam at incident power density of 152 $kW/cm^2$ for the Z-cut crystal samples.

It can be seen that both −Z and +Z faces of these samples can maintain a bright beam spot with a good beam shape at the center of the images. However, the −Z face of Fe:CLN is damaged due to its strong backward scattering (FIG. 7b).

Figure 8:
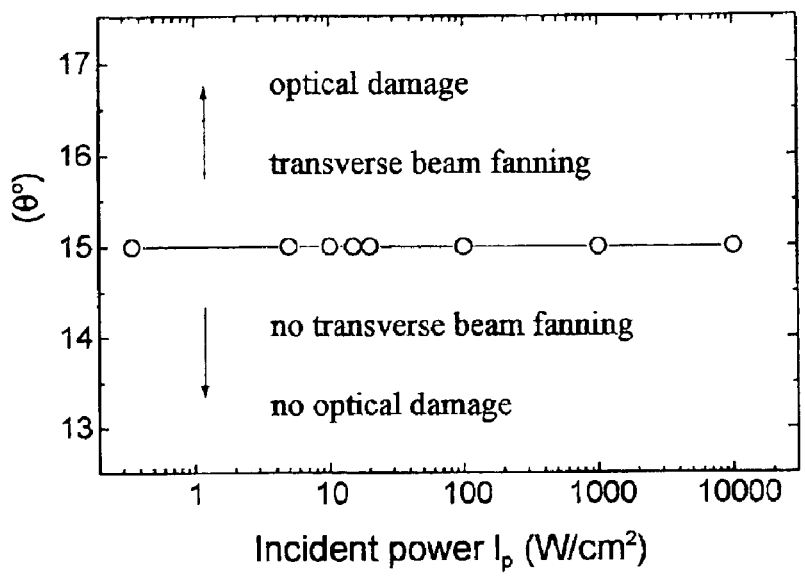
FIG. 8 illustrates the angular tolerance of the Z-cut crystal samples.

For the Z-cut terbium doped samples, angular tolerance was also measured using the experimental setup in FIG. 2. The angle θ was varied from 0° to 45°. Referring to FIG. 8, it was observed that transverse beam fanning effects occurred when the angle θ was increased to 15° and above. When θ was increased to about 45° optical damage effects were observed. The experiment for angular tolerance was conducted using laser beams with power intensities ranging from 1 W/cm$^2$ to 10,000 W/cm$^2$; the results were consistent for the entire range.

Figure 9:
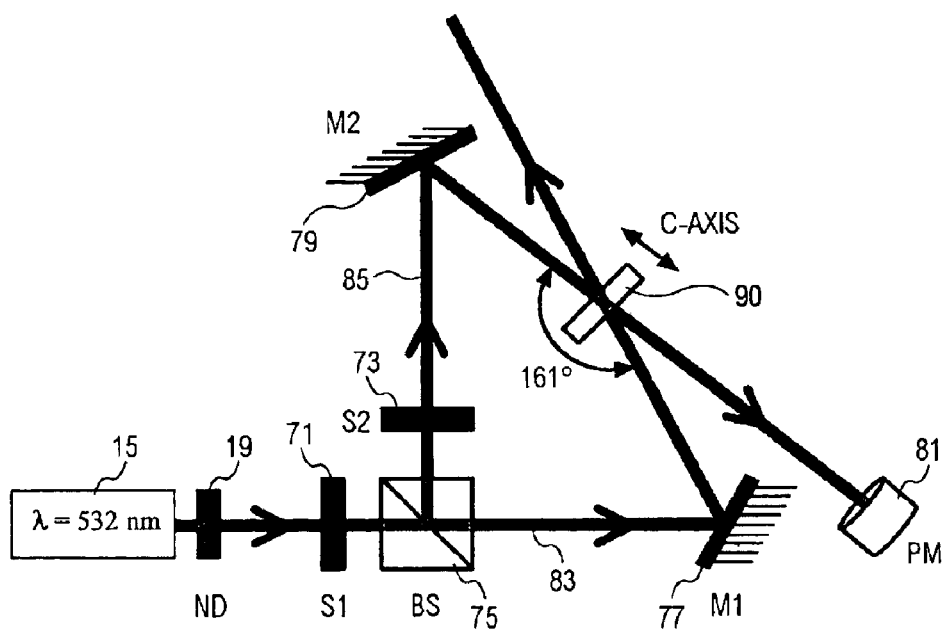
FIG. 9 illustrates the experimental setup for recording the plane-wave hologram under the reflection geometry in accordance with the present invention.

Further experiments were also conducted to determine data write rates of the Z-cut terbium doped samples. Referring to FIG. 9, the experimental setup for determining the data write rate is shown. The experimental setup was prepared in a Reflection Geometry configuration specifically catering to the Z-cut configuration of the recording medium which in the present experiment is the Z-cut Fe:Tb:SLN-1 crystal sample.

The laser source 15 is incident on a Beam Splitter (BS) 75 such that the laser beam is split into a reference beam 83 and an object beam 85. The two beams are then reflected off a first mirror 77 and a second mirror 79 respectively such that the two beams are incident on opposing sides of the Z-cut Fe:Tb:SLN-1 crystal sample 90 and intersect in the Z-cut Fe:Tb:SLN-1 crystal sample 90. The initial beam intensity is varied using the neutral density filter 19. A first shutter 71 and a second shutter 73 are used to control the object beam 85.

A power meter 81 is aligned with the object beam 85 after the Z-cut Fe:Tb:SLN-1 crystal sample 90 for measuring the intensity of diffracted light of the reference beam 83.

It is known that low sensitivity of photorefractive crystals used in recording media has limited data write rates and thus limited applications in holographic recording. The typical photorefractive sensitivity S of a photorefractive crystal is defined as, $$S=(d\sqrt{\eta}/dt)_{t=0}/(I_0 L) \quad (1)$$

where $\eta$ is the diffraction efficiency, t is the time, $I_0$ is the total recording laser intensity, and L is the crystal thickness. Therefore, write rate $V_w$ is proportional to $I_0$ and can be expressed as $$V_w \propto (d\sqrt{\eta}/dt)_{t=0} = S I_0 L \quad (2).$$

Figure 10:
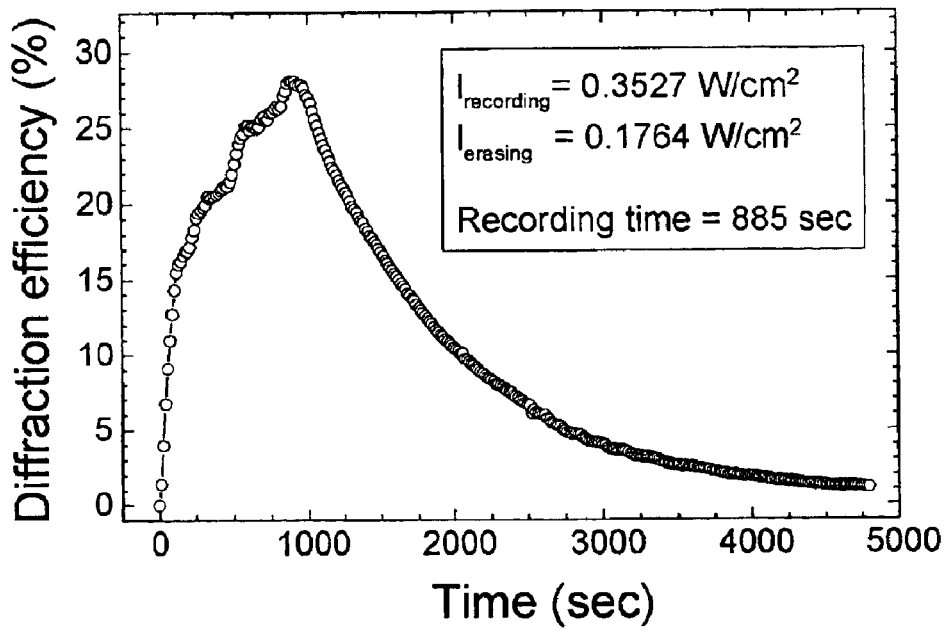
FIG. 10, FIG. 11 and FIG. 12 illustrate graphs showing results of experiments of FIG. 9.
Figure 11:
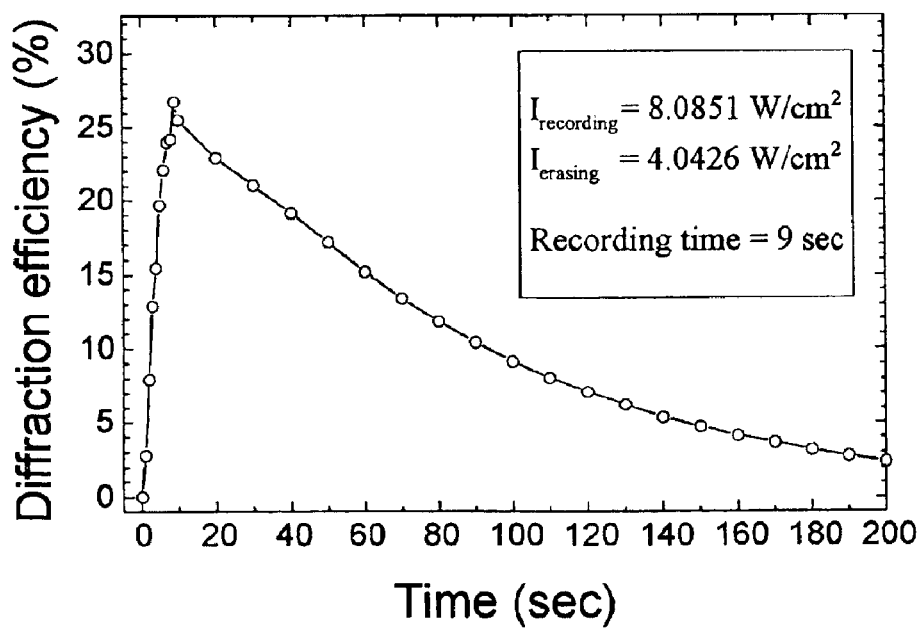
Figure 12:
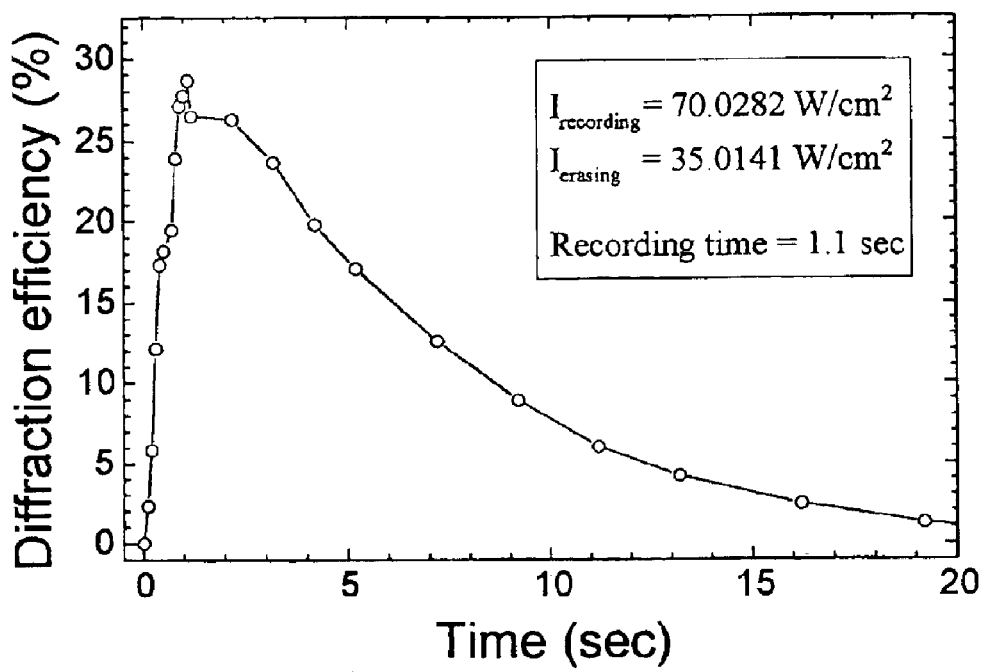

Data write rate $V_w$ can thus be increased significantly by increasing the recording intensity $I_0$. Experiments were conducted writing and erasing single plane-wave holograms at different laser power densities and the results are shown in FIG. 10, FIG. 11 and FIG. 12. Where the diffraction efficiency is defined as the intensity ratio between the diffracted and incident beams, $I_{recording}$ is the total intensity of recording beams (object and reference beams), $I_{erasing}$ is the intensity of the reference beam, and the total recording time is the time required for the diffraction efficiency to reach saturation.

Referring to FIG. 10, FIG. 11 and FIG. 12, the low beam fanning and high optical damage resistance characteristics of the Z-cut Fe:Tb:SLN-1 crystals are evidently highly advantageous. The incident beam intensity on the Z-cut Fe:Tb:SLN-1 crystal ranged from 0.3527 W/cm² to 8.0851 W/cm² to 70.0282 W/cm². Conventional photorefractive crystals used for recording media would have been optically damaged at a mere fraction of the incident beam intensifies the present Z-cut Fe:Tb:SLN-1 crystals were exposed to. The recording times ranged respectively from 885 seconds, to 9 seconds to 1.1 seconds. The present Z-cut Fe:Tb:SLN-1 crystal is clearly advantageously able to withstand an incident beam intensity in excess of 70 W/cm² and achieving a recording time of a mere 1.1 seconds.

Figure 13:
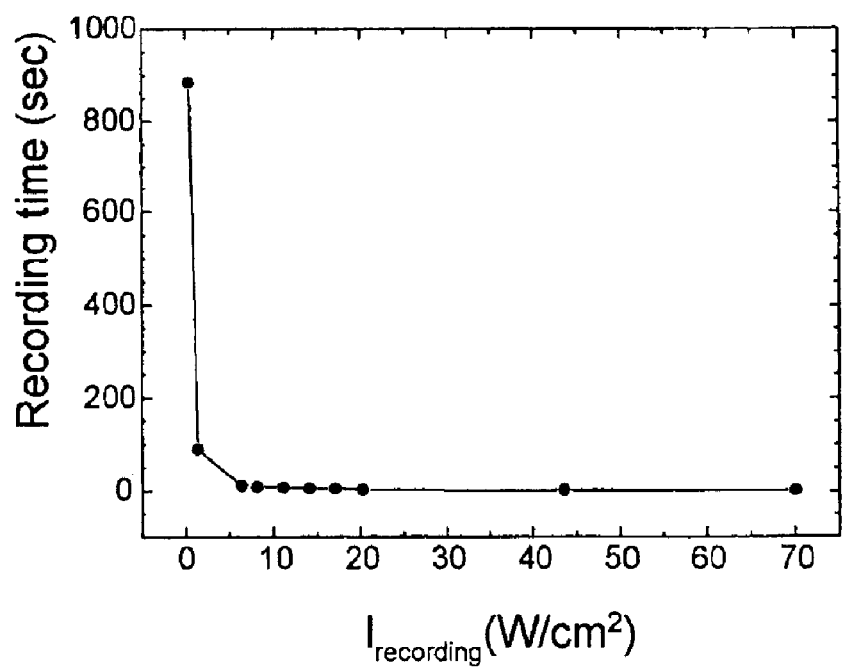
FIG. 13 illustrates the relationship between total recording time and total recording power density $I_{recording}$ (W/cm²).

The relationship of the total recording time with the total recording power density is shown in FIG. 13. It is observed that the total recording time is reduced substantially from 885 seconds to 9 seconds just by increasing the total recording power density $I_{recording}$ from 0.3527 W/cm² to 8.0851 W/cm². It seems that there is a critical value for $I_{recording}$, above which the recording time decreases substantially. Referring to FIG. 13, this value is estimated at around 1 W/cm².

This phenomena will never occur in the X-cut crystals due to the conventional transverse beam-fanning and optical-damage effects (Table 2). For the Z-cut Fe:CLN crystal, it is difficult to record holograms at high power density because its −Z face can be optically damaged at high power density.

Figure 14:
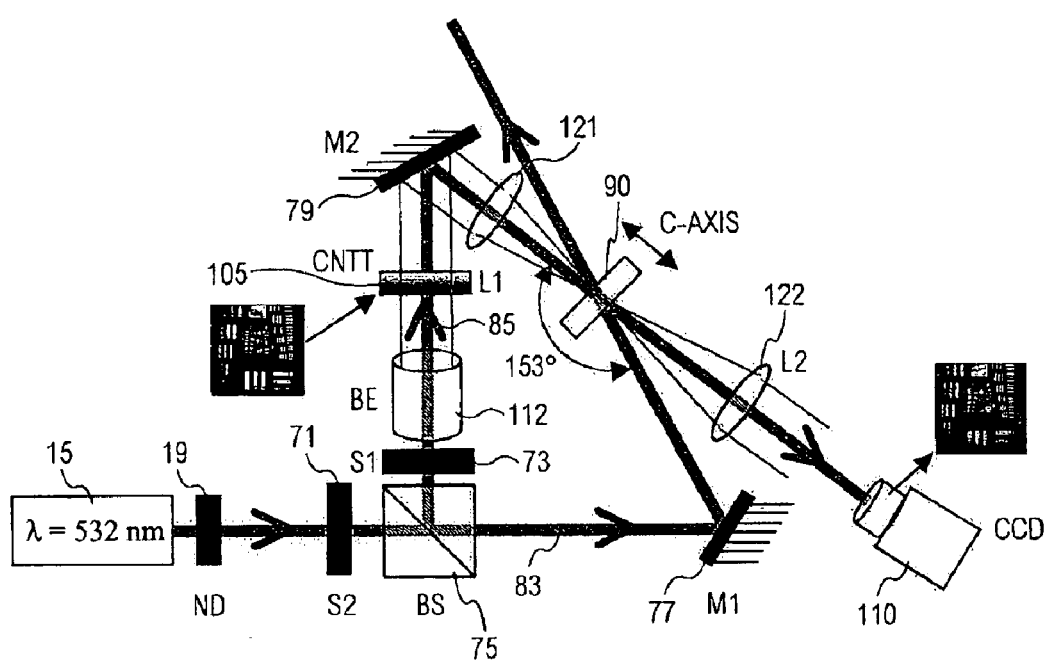
FIG. 14 illustrates the experimental setup for determining the recording speed of an image-bearing hologram under the reflection geometry in accordance with the present invention.

Further experiments were conducted to determine the recording speed using reflection geometry in accordance with the present invention. Referring to FIG. 14, the experimental setup in FIG. 9 was modified to allow use of a chromium negative test target (CNTT) 105 to provide a single image. A beam expander 112 is placed between the second shutter 73 and a CNTT 105 before the second mirror 79. A CCD camera 110 replaces the power meter 81. Furthermore, a first lens 121 is used to focus the object beam 85 onto the crystal sample 90 and a second lens 122 is used to image the retrieved signal image onto the CCD camera 110.

The image bearing object beam 85 is focused onto the crystal sample 90 to effectively obtain a power density of about 81.5 kW/cm². The power density of the reference beam 83 is about 38 W/cm². Angle between the object beam 85 and the reference beam 83 at the crystal sample 90 is about 153°.

Figure 15:
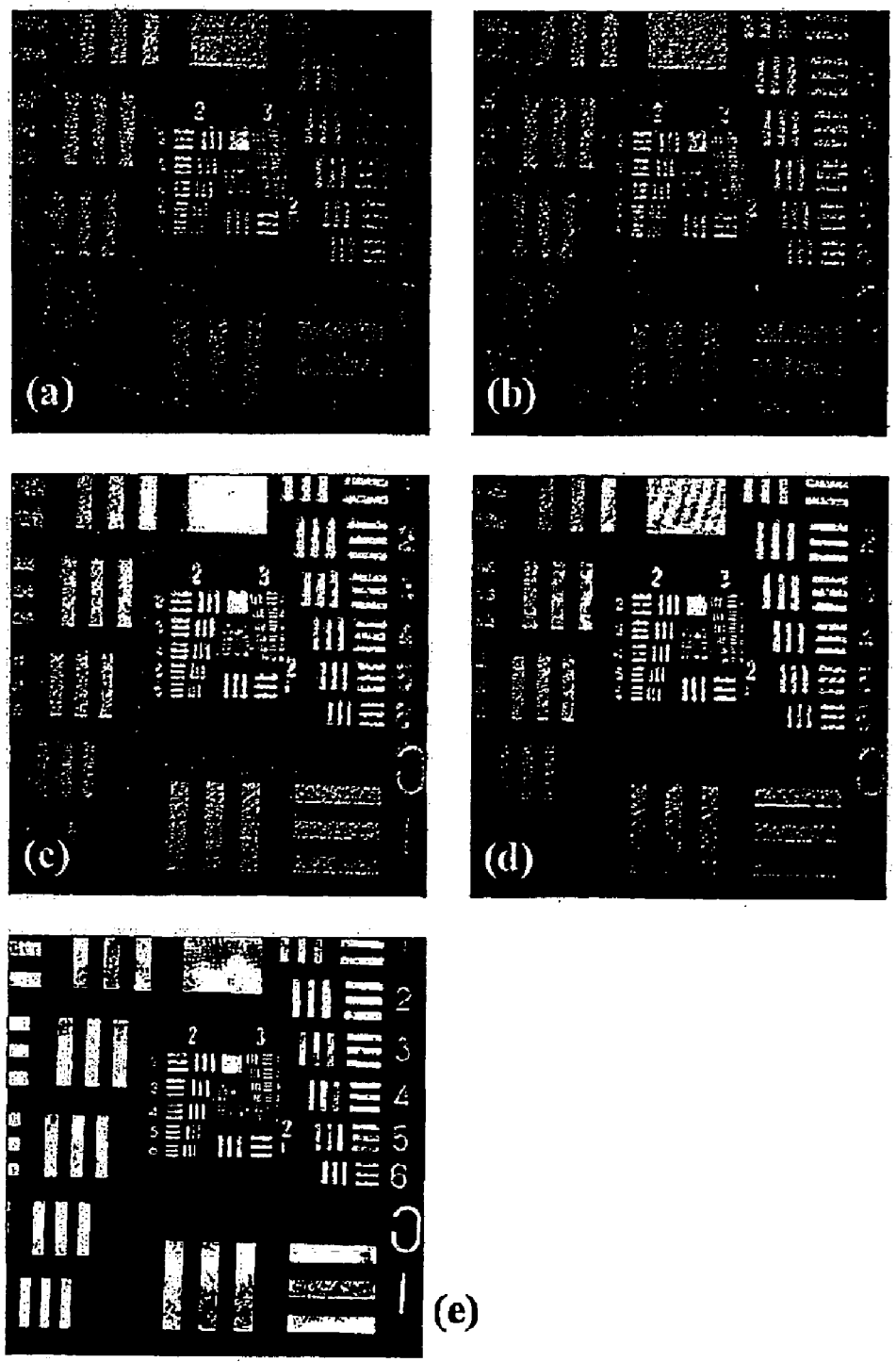
FIG. 15 illustrates reliable retrieval of a single-image hologram recorded within 1–10 milliseconds.

Experiments were then conducted to obtain the shortest exposure me for recording the image from the CNTT 105. The stored image is reconstructed using the weak reference beam 83 to allow the CCD camera 110 to capture the reconstructed image. The captured reconstructed images are shown in FIG. 15, where recording times of a) 1 msec, b) 2 msec, c) 3 msec, and d) 10 msec.

FIG. 15e) is the captured image of direct transmitted image from the crystal and is used mainly as a comparison for the other captured images. From FIG. 15c) it can be observed that a 3 msec exposure of the image bearing hologram into the crystal sample 90 is sufficient for an acceptable reconstruction of the image.

The present experimental setup is also representative of the method for high-speed holographic data storage using doped stoichiometric lithium niobate crystals. The recording medium of the method is the Z-cut crystal of terbium and iron doped storichiometric lithium niobate in accordance with the present invention.

Recording of the holographic data is further performed in a Reflection geometry configuration. The image bearing object beam 85 is focused onto the crystal sample 90 to effectively obtain a power density of about 81.5 kW/cm². Angle between the object beam 85 and the reference beam 83 at the crystal sample 90 is about 153°.

Experiments were then conducted to obtain the shortest exposure time for recording the image from the CNTT 105. The stored image is reconstructed using the weak reference beam 83 to allow the CCD camera 110 to capture the reconstructed image. The recording times varies from 1 msec to 10 msec.

The disclosed recording medium of the present invention comprises an improved Terbium (Tb) and iron (Fe) doped Stoichiometric Lithium Niobate (SLN) crystal for high-speed holographic data storage which has an extremely high optical damage resistance along the Z axis. This high optical damage resistance has been recorded at power density of more than 145 kW/cm². This property advantageously allows the focusing of high power intensity laser beams onto the crystal, thus achieving high data write rates.

Recording times have been recorded to be very rapid at about 1 second for a single hologram with a saturated diffraction efficiency of 28.7% at a total recording laser beam density of 70 W/cm². Reliable retrieval of a signal-image written at as low as 1 milliseconds has been performed in the Z-cut doped SLN. The present recording medium comprises an improved doped SLN of a Z-cut SLN crystal doped with Iron (Fe) and Terbium (Tb). The Terbium (Tb) content within the fluxed melts for growing the improved doped SLN ranges from 10 ppm to 140 ppm.

It will be appreciated that various modifications and improvements can be made by a person skilled in the art without departing from the scope of the present invention.

What is claimed is:

1. A recording medium for high-speed holographic data storage, comprising a Z-cut crystal of terbium and iron doped stoichiometric lithium niobate;

wherein said crystal has an optical damage resistance of more than 145 kW/cm$^2$ and exhibits negligible transverse beam fanning when a laser beam is incident at an angle less than 15° from a Z-axis of said crystal; further wherein terbium content within fluxed melts for growing said crystal ranges from 10 ppm to 140 ppm.

2. The recording medium in accordance with claim 1, wherein said crystal is utilized in a Reflection geometry configuration.

3. The recording medium in accordance with claim 2, wherein angle of incidence of an object beam or reference beam on said crystal is less than 15° from the Z-axis of said crystal.

4. The recording medium in accordance with claim 2, wherein said crystal exhibits a recording time of about one second for a single recorded hologram with a saturated diffraction efficiency of 28.7% at a total recording laser beam density of about 70 W/cm$^2$.

5. The recording medium in accordance with claim 2, wherein said crystal is capable of storing a single-image within 1 to 10 milliseconds of exposure of a reference beam and an object beam bearing the single image.

6. A method for high-speed holographic data storage, using a Z-cut crystal of terbium and iron doped stoichiometric lithium niobate as a recording medium, said method comprising:

utilizing said crystal in a Reflection geometry configuration; and exposing said crystal to a reference beam and an object beam bearing one image.

7. The method in accordance with claim 6, wherein terbium content within fluxed melts for growing said crystal ranges from 10 ppm to 140 ppm.

8. The method in accordance with claim 6, wherein said angle of incidence of said object beam or reference beam on said crystal is less than 15° from a Z-axis of said crystal.

9. The method in accordance with claim 6, wherein said crystal has an optical damage resistance of more than 145 kW/cm$^2$ and exhibits negligible transverse beam fanning when a laser beam is incident at an angle less than 15° from a Z-axis of said crystal.

10. The method in accordance with claim 6, wherein said object beam and reference beam are exposed to said crystal from 1 to 10 milliseconds.

* * * * *